United States Patent [19]
Kulik et al.

[11] Patent Number: 5,667,852
[45] Date of Patent: Sep. 16, 1997

[54] PLASMA JET CVD METHOD OF DEPOSITING DIAMOND OR DIAMOND-LIKE FILMS

[75] Inventors: Pavel P. Kulik; Vladimir V. Ivanov; Eugenia N. Zornia, all of Moscow, Russian Federation; John A. Gay, Newmarket, Great Britain

[73] Assignee: Overseas Publishers Association, Amsterdam, Netherlands

[21] Appl. No.: 619,718

[22] PCT Filed: Sep. 21, 1994

[86] PCT No.: PCT/EP94/03160

§ 371 Date: Sep. 3, 1996

§ 102(e) Date: Sep. 3, 1996

[87] PCT Pub. No.: WO95/08657

PCT Pub. Date: Mar. 30, 1995

[30] Foreign Application Priority Data

Sep. 23, 1993 [GB] United Kingdom .................. 9319627

[51] Int. Cl.$^6$ ............................. B05D 3/06; C23C 16/26
[52] U.S. Cl. ............................ 427/577; 427/580; 427/249
[58] Field of Search ............................ 427/577, 580, 427/249; 423/446

[56] References Cited

U.S. PATENT DOCUMENTS 4,645,977  2/1987  Kurokawa et al. .
4,767,608  8/1988  Matsumoto et al. .
5,094,878  3/1992  Yamamoto et al. ................ 427/580
5,382,293  1/1995  Kawarada et al. .............. 118/723 DC

FOREIGN PATENT DOCUMENTS 0 286 306  10/1988  European Pat. Off. .
0 481 722  4/1992  European Pat. Off. .

OTHER PUBLICATIONS

K.R. Stalder et al. "*Plasma Properties of a Hydrocarbon Arcjet Used in the Plasma Deposition of Diamond Thin Films*", Aug. 27, 1990., pp. 6187–6190.

R. S. Yalamanchi et al. "*Diamond Growth in Combustion Flames*" Jul. 13, 1990, pp. 5941–5943.

Patent Abstracts of Japan, unexamined applications, C Field, vol. 11,, No. 115, Apr. 10, 1987, The Patent Office Japanese Government, p. 136 C 415 & JP-A-61 259 778.

Primary Examiner—Roy V. King
Attorney, Agent, or Firm—Lowe, Price, LeBlanc & Becker

[57] ABSTRACT

The invention relates to electronics and optical industry technology. Deposition of diamond and diamond-like films is performed in a plasma flux at atmospheric pressure at a temperature $T=10^{4°}$ K. A mixture of hydrocarbons and hydrogen is fed to a plasma flux formed by the confluence of a plurality of jets. As a result of the processes occurring in the plasma flux, there is deposited on the substrate a diamond or diamond-like film having a high degree of adhesion to the substrate, at a rate of 1 micron/sec, which substantially exceeds the rate of deposition of similar films by known methods.

6 Claims, No Drawings

PLASMA JET CVD METHOD OF DEPOSITING DIAMOND OR DIAMOND-LIKE FILMS

FIELD OF THE INVENTION

This invention relates to methods for obtaining diamond and diamond-like films and substrates from the gaseous phase, particularly, though not exclusively, for use in the electronics industry, and it may be used to form layers in passive and active electronic components, and also to obtain optical windows in the visible and infra-red regions of the spectrum, to form interference filters, and to provide coatings.

BACKGROUND ART

A previously proposed method for obtaining diamond and diamond-like films from hydrocarbons, for example from acetylene, includes the steps of forming an acetylene-oxygen mixture, feeding the mixture under atmospheric pressure to a torch, igniting the oxyacetylene flame and forming a diamond film on a substrate at a rate of 0.003–0.015 micron/sec. This method has been described in J. Appl. Phys. v. 68, N11, 1991, pp. 5941–5943. The disadvantage of this method is the comparatively low rate of formation of the coatings, and also the considerable lack of uniformity in thickness.

Another method that has previously been proposed for obtaining diamond and diamond-like films from a plasma jet has been described in J. Appl. Phys. v. 68, N12, 1990, pp. 6187–6190. This method includes forming a mixture of methane and hydrogen (about 5% methane in hydrogen), and using this mixture as a plasma-forming gas to ignite a plasma jet in a single-jet plasmatron with a tungsten anode and a tantalum cathode at a total pressure in the system of 400 torr. The consumption of the gaseous mixture is 1–2 liters/min and the arc current is equal to 10–12 A at a voltage of 60–90 V. The rate of formation of the films by this method reached 0.06–0.03 micron/sec.

In previously proposed arrangements for obtaining diamond and diamond-like films a plasma reaction zone is formed, a hydrocarbon-hydrogen mixture is then fed to the reaction zone, and a diamond film is obtained on a cooled substrate. The disadvantage of this method is also the relatively low rate of growth of the films, which is reflected in the productivity of the process, particularly when obtaining thick layers.

SUMMARY OF THE INVENTION

The technical result achieved by the presently proposed method results in a substantial increase in the growth rate of the films, i.e. in an increase in the productivity of the process, which is particularly important when producing thick films.

In one arrangement which will be described as an example of the present invention, a method for obtaining diamond and diamond-like films includes forming a plasma reaction zone, feeding a hydrocarbon-hydrogen mixture to the reaction zone, and depositing a film on a substrate, the reaction zone being formed by a plasma flux at atmospheric pressure and at a temperature $T=10^{4\circ}$ K., the flux including at least three axially symmetrically arranged convergent jets, and the film is being deposited while the substrate is passed at a high velocity not less than once through the flux zone.

DESCRIPTION OF A PREFERRED EMBODIMENTS

The presently proposed method is carried out in one embodiment as follows. Using a plurality of electrodes and an external arc, a plasma flux is generated at atmospheric pressure at a temperature $T=10^{4\circ}$ K. in the form of axially symmetrically arranged convergent jets of an inert gas with the current in the arc being of 10 to 20 A at a voltage of 90–100 V. A gaseous mixture of hydrocarbons in hydrogen is introduced into the reaction zone of confluence at a rate of 0.1 to 10 liters/min and a cooled substrate is passed through the plasma flux at a temperature $T=10^{4\circ}$ K. at a rate of 0.1 to 10 meters/min (depending on the substrate material). The amount N of substrate passing through the plasma zone is chosen to be equal to or greater than 1.

By way of example, the formation of diamond and diamond-like films on a silicon substrate will now be considered. The substrate is mounted on a movable table arranged at a predetermined distance from the electrodes. A gaseous mixture of methane and hydrogen formed by mixing the gases supplied from cylinders is introduced by means of a feed device into a plasma flux formed by four convergent plasma jets. The use of a plasma flux at atmospheric pressure and a temperature $T=10^{4\circ}$ K. ensures complete disassociation, activation and partial ionization of the gaseous mixture of methane and hydrogen introduced into the zone of confluence of the plasma jets of the flux.

The substrate mounted on the movable table which is cooled intersects the plasma flux, as a result of which a polycrystalline diamond film or amorphous diamond-like film, depending on the percentage content of the methane in the hydrogen, is deposited on the surface of the substrate, and at the same time a good adhesion of the film to the substrate is observed.

It is found that a concentration of 1–2% of methane in hydrogen results in the growth of a diamond-like film of hydrogenated carbon, while a concentration of 5–10% of methane in hydrogen results in the growth of a polycrystalline diamond film. The growth rate in both cases is 1 micron/sec. As a substrate there may be used various metallic materials, including aluminium, steel, titanium, molybdenum, silicon-type and germanium-type semiconductor materials, dielectrics, as well as silicon dioxide, various glasses, titanium nitride, aluminium oxide, various polymers, including polyethylene, polyurethane, organosilicon and organofluorine polymers and other materials. Temporary substrates having zero adhesion to diamond-like films may be used for optical windows. Suitable substrates for this purpose include copper and gold.

Compared with the known methods, the presently described method for obtaining diamond and diamond-like films enables the productivity of the process to be substantially increased (approximately by a factor of 2), while achieving a high degree of adhesion. The method may be recommended for use in electronics and also to obtain optical windows and interference filters in the visible and infra-red regions of the spectrum.

Although the invention has been described, by way of example, with reference to a particular embodiment, it will be understood that variations and modifications thereof, as well as other embodiments, within the scope of the appended claims may be employed.

We claim:

1. A method of obtaining a diamond or diamond-like film from the gas phase comprising:
    forming a plasma reaction zone, feeding a mixture of hydrocarbons and hydrogen to the zone, depositing the diamond or diamond-like film on a substrate, the reaction zone being formed by a plasma flux at atmospheric pressure and at a temperature T of about $10^{4\circ}$ K., said flux comprising at least three axially symmetrically arranged convergent jets, said diamond or diamond-like film being formed on the substrate by passing the substrate at a high velocity at least once through the plasma flux zone.

2. A method as claimed in claim 1 wherein the mixture of hydrocarbons is gaseous, and further comprising introducing hydrogen into the zone at a rate of 0.1 to 10 liters/min, the substrate being cooled and passed through the plasma flux at a rate of between 0.1 to 10 meters per minute.

3. A method as claimed in claim 1 in which the plasma flux is formed using a plurality of electrodes and an external arc employing a current of between 10 to 20 A at a voltage of between 90 to 100 V.

4. A method as claimed in claim 1 in which there is between 1% and 10% by volume of methane in the hydrogen.

5. A method as claimed in claim 2 in which there is between 1% and 10% by volume of methane in the hydrogen.

6. A method as claimed in claim 3 in which there is between 1% and 10% by volume of methane in the hydrogen.

* * * * *